(12) United States Patent
Wong (10) Patent No.: US 7,092,289 B1
(45) Date of Patent: *Aug. 15, 2006

(54) EFFICIENT REDUNDANCY SYSTEM FOR FLASH MEMORIES WITH UNIFORMLY SIZED BLOCKS

(75) Inventor: Sau Ching Wong, Hillsborough, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 50 days.

This patent is subject to a terminal disclaimer.

(21) Appl. No.: 10/611,465

(22) Filed: Jun. 30, 2003

Related U.S. Application Data (62) Division of application No. 09/927,693, filed on Aug. 9, 2001, now Pat. No. 6,614,685.

(51) Int. Cl.
*G11C 16/08* (2006.01)
*G11C 16/06* (2006.01)
*G11C 29/00* (2006.01)
*G11C 8/10* (2006.01)

(52) U.S. Cl. .......................... 365/185.09; 365/185.33; 365/200; 365/230.02; 365/185.11; 365/230.03; 714/710; 711/202

(58) Field of Classification Search ................. 365/49, 365/200, 185.09, 185.33, 189.04, 230.03, 365/185.11, 230.02; 711/108, 202; 714/710, 714/711
See application file for complete search history.

(56) References Cited

U.S. PATENT DOCUMENTS

| | | | |
|---|---|---|---|
| 5,233,559 A * | 8/1993 | Brennan, Jr. ............ 365/185.09 |
| 5,621,690 A * | 4/1997 | Jungroth et al. ............ 365/200 |
| 5,758,056 A | 5/1998 | Barr | |
| 5,835,436 A * | 11/1998 | Ooishi .................... 365/230.03 |
| 6,088,264 A | 7/2000 | Hazen et al. | |
| 6,233,181 B1 | 5/2001 | Hidaka | |
| 6,260,103 B1 | 7/2001 | Alexis et al. | |
| 6,426,893 B1 | 7/2002 | Conley et al. | |
| 6,614,685 B1* | 9/2003 | Wong .................... 365/185.11 |
| 6,665,221 B1* | 12/2003 | Abedifard et al. .......... 365/200 |

OTHER PUBLICATIONS

Intel, "Preliminary Datasheet for 1.8 Volt Intel® Wireless Flash Memory (W18)," Order No. 290701-002 (Jan. 2001) pp. 1-79.

Pathak, B. et al., 2001 IEEE International Solid-State Circuits Conference, Session 2, Non-volatile Memories, "2.3 A 1.8V 64Mb 100 MHz Flexible Read While Write Flash Memory" (Feb. 5, 2001).

* cited by examiner

*Primary Examiner*—Richard Elms
*Assistant Examiner*—J. H. Hur
(74) *Attorney, Agent, or Firm*—Volentine Francos & Whitt (57) ABSTRACT

A Flash memory that stores data, code, and parameters and performs parallel operations employs uniform-size blocks in array planes. A redundancy system for the Flash memory uses a CAM and a RAM for address comparison and substitution when replacing addresses corresponding to defective memory elements. The uniform block size allows block replacement where spare blocks in the array planes replace defective blocks. To reduce access delays from signal propagation through the CAM and RAM, part of the input address such as the row address goes directly to decoders while another part of the input address such as the block address goes to the CAM array for comparison.

15 Claims, 7 Drawing Sheets

EFFICIENT REDUNDANCY SYSTEM FOR FLASH MEMORIES WITH UNIFORMLY SIZED BLOCKS

CROSS-REFERENCE TO RELATED PATENT APPLICATION

This is a divisional of U.S. patent application Ser. No. 09/927,693, filed on Aug. 9, 2001, now U.S. Pat. No. 6,614,685.

BACKGROUND

Data storage Flash memories generally have uniform and small block sizes and often provide additional memory space for error correction codes (ECCs). For example, a NAND-type Flash memory typically provides 512 bytes of ECC memory (not useable for data) in every block containing 16 K bytes of data storage. These memories often have minimum pin counts with either serial or multiplexed interfaces and are often used in small Flash memory cards for portable applications. For long-term reliability, such memories typically provide real-time sector-mapping features similar to those found in Hard Disk Drives (HDDs). For example, NAND-type Flash memories, used in Smart Media Cards, specify that a small number of blocks may be invalid, due to one or more defective bits. The system design must be able to mask out the invalid blocks via address mapping. Such memories are sometimes called Mostly Good Memories (MGM) and typically guarantee a minimum of about 98% good bits.

Compact Flash (CF) and Multi Media Cards (MMCs) typically use NOR-type Flash memories that provide features to improve the endurance. For example, the memory may have an intelligent erase algorithm with verification to avoid over-stressing the oxide and improve program/erase (P/E) cycle endurance. Sector "tagging" (or sector hot counts) in such memories keep track of P/E cycling history so that the erase voltage can be set for each sector individually, according to the sector's P/E cycling history. In additional, such Flash memories generally provide real-time replacement of a sector after the sector has reached a pre-set lifetime maximum number of P/E cycles.

Flash memories for combined parameter, code, and data storage typically have asymmetric block sizes that are optimized to store different types of information. In general, these memories lack extra memory space for ECC and real-time sector-mapping capabilities but do provide parallel operations (POs) such as read-while-write (RWW) or read-while-erase (RWE), which allow a processor or another external device to write to or erase one part of the memory chip while reading from another part of the same memory chip. This capability increases system performance, and reduces overall system cost by eliminating additional memory chips such as system SRAM for program updates or EEPROM to store system parameters.

A 2001 ISSCC paper 2.3 titled "1.8v 64 Mbit 100 MHz Flexible Read While Write Flash Memory" (ISSCC Article), which is incorporated by reference in its entirety, describes a Flash memory device with flexible RWW capabilities based on a "Multiple Partition" architecture, which allows parallel operations for code and data. Intel's 1.8v Wireless Flash Memory Datasheet (28F640W18), which is also incorporated by reference in its entirety, further describes the memory described in the ISSCC Article.

Figure 1:
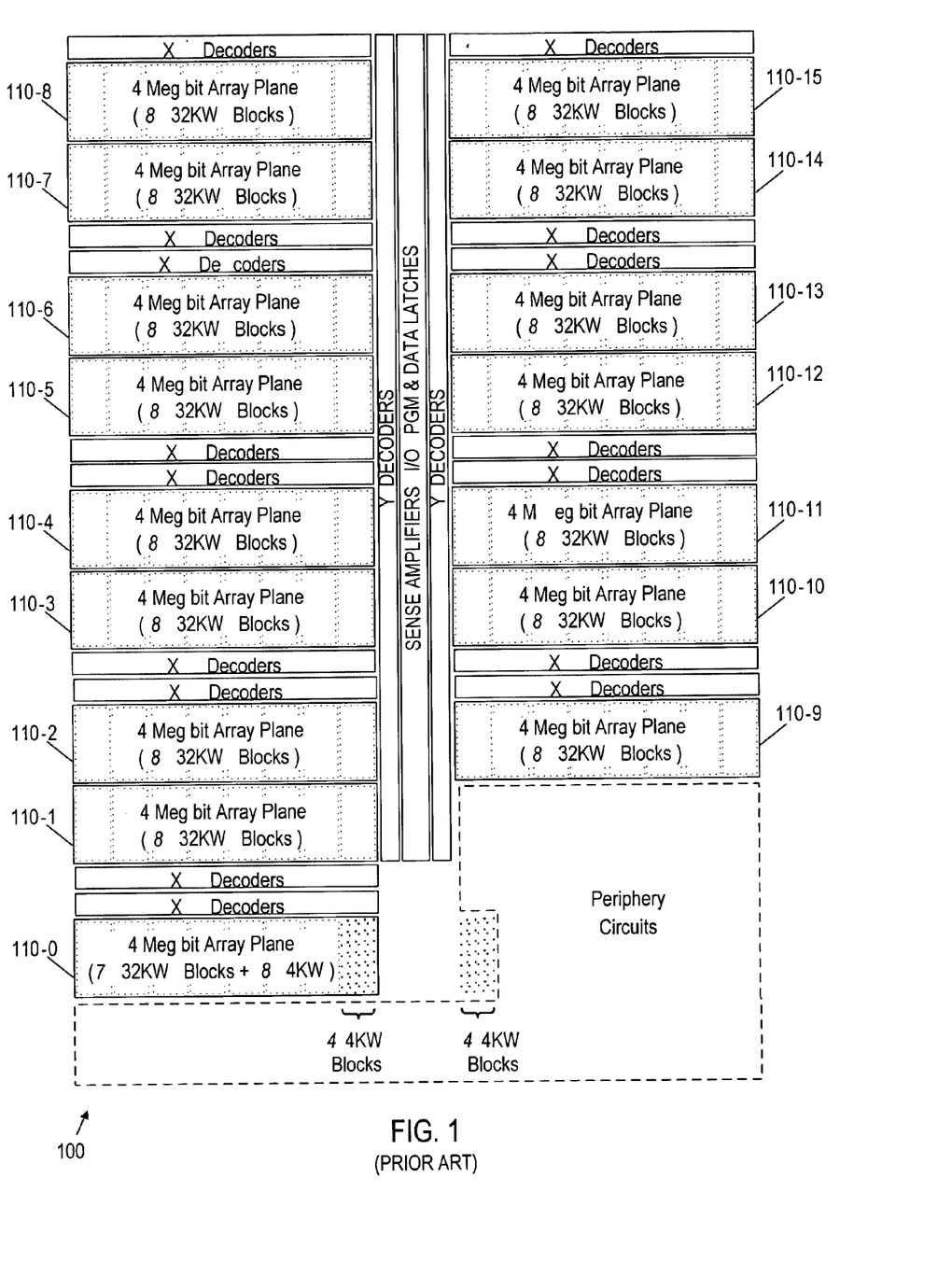
FIG. 1 shows the layout of a known Flash memory containing parameter blocks and main blocks that differ in storage capacity.

FIG. 1 illustrates the layout of a 64-megabit device 100 shown in a die micrograph in the ISSCC paper. Memory device 100 has sixteen array planes 110-0 to 110-15, generically referred to as array planes 110. Each array plane 110 has the same storage capacity and specifically contains four megabits of storage. With the hardware partitioning of memory 100 into array planes 110, the user of memory 100 can initiate a write or erase operation in any one of the sixteen array planes 110 while simultaneously reading in any of the other fifteen array planes 110. In memory 100, the selected word and bit lines in the array plane selected for the write or erase operation are biased at the program or erase voltages; while the selected word and bit lines in the array plane selected for the read operation are biased at read voltages.

The erase, write, and read status of each array plane 110 is stored in an on-chip state-machine (not shown), and the user changes the erase, write, and read status of an array plane 110 by issuing commands to Flash memory 100. Memory 100 generally allows reading in one array plane while writing or erasing in another array plane. Table 1 shows some of the possible parallel operation scenarios for memory 100.

TABLE 1

| First operation in one array plane: | Allowed Parallel Operation in Another Array Plane | | |
|---|---|---|---|
| | Read | Program | Erase |
| Idle | X | X | X |
| Read | | X | X |
| Program | X | | |
| Erase | X | | |

Memory 100 permits allocation of array planes 110 for specific purposes. An example allocation of the memory space uses four array planes 110 for an operating system (or Real Time OS), two array planes 110 for a boot sector, and the remaining ten array planes 110 for file management. With this allocation and the RWW capability, a CPU can simultaneously read code of the Real Time OS while writing or erasing data in the file management sections. The RWW architecture, in which a user can seamlessly access data across various array plane or partition boundaries, increases the overall system performance.

As shown in FIG. 1, one of array plane 110-0 is adapted for parameter storage, while fifteen array planes 110-1 to 110-15 are intended for main storage. More specifically, each of the 4-megabit array planes 110-1 to 110-15 contains eight 32-Kword "main" blocks, while the 4-megabit parameter array plane 100-0 contains eight 4-kword "parameters" blocks and seven 32-Kword main blocks. Each 32-Kword or 4-Kword block is independently erasable as a block.

The bulk of the storage capacity of memory 100 is in the main blocks and can store code or data. The parameter blocks in array plane 110-0 are smaller for more efficient storage of parameters because parameters generally come in smaller units and are more frequently updated. For example, in a MP3 player, data representing music comes in relatively large units that are efficiently stored in the main blocks, and control parameters such as directory information requires less storage but is more frequently changed. More conventional system using a data storage Flash memory would normally store parameters in a separate EEPROM to improve storage efficiency and allow access to parameters while accessing data. However, software techniques allow Flash memory 100 to emulate the word-rewrite functionality of EEPROMs. As a result, the asymmetrically blocked architecture enables code, parameters, and data integration within a single memory device.

Flash memories with similar parallel operation capabilities and asymmetric block architectures are described in the datasheet for the Simultaneous Operation Flash Memory (Am29DL323C) available from Advanced Micro Devices, Inc. and the datasheet for the Concurrent Flash (AT49BV1604 & AT49BV1614) available from Atmel, Inc. These datasheets are hereby incorporated by reference in their entirety.

The 32 Meg bit device of AMD is divided into two banks, with bank 1 containing 8 megabits and bank 2 containing 24 Meg bits. Bank 1 is further segmented into fifteen 32-Kword blocks and eight 4-Kword blocks, while bank 2 is segmented into forty-eight 32-K word blocks. In actual application, the user can structure bank 1 to store data and boot code, and bank 2 to store control code. The command sequence that tells bank 1 to program or erase data blocks resides as executable codes in bank 2. While bank 1 is being programmed or erased, the system can continue to execute code from bank 2 to manage other system operations. Depending on system implementation, the CPU can also execute code from bank 1, and program or erase any of the blocks in Bank 2.

A 16-megabit memory device from Atmel, Inc. has a bank containing 12 megabits and a bank containing 4 megabits and allows a read operation in one bank while the other bank performs a write operation. Furthermore, the device has 40 blocks including thirty 32-Kword main blocks, eight 4-Kword parameter blocks, and two 16-Kword boot blocks.

One of the disadvantages of asymmetric block architectures is the inability to layout the arrays with symmetry and balance. For example, the 64-megabit memory of FIG. 1 has a layout in which array plane 110-0, which contains the parameter blocks, requires more integrated circuit area than do each of array planes 110-1 to 110-15. The parameter blocks contain less storage (i.e., fewer memory cells) than the main blocks do, and the parameter blocks require proportionally more overhead because of the need for a block select transistor per block. Block select transistors connect the local bit lines (within a block) to the global bit lines (across all blocks in the same array plane). For stacked-gate NOR Flash with negative-gate-channel-erase, additional overhead associated with the independent P-well inside a separate Deep N-well, is required for each block. Since the width of array planes 110-1 to 110-8 on the left side of memory 100 is less than the required width of array plane 110-0, part of array plane 110-0 is on the right side of memory 100 with array planes 110-9 to 110-15. Peripheral circuitry 120 is around the blocks of array plane 110-0 that are on the right side of memory 100. Additionally, Flash memory 100 has nine array planes 110-0 to 110-8 on the left side and only seven array planes 110-9 to 110-15 on the right side.

Memories with asymmetric block architectures and array layouts such as illustrated in FIG. 1 have significant drawbacks. In particular, since block sizes are non-uniform and hardwired, these memories cannot provide complete flexibility in array partitioning. Only specific array planes are adapted for storage of parameter data. Therefore, these memories are unable to support all applications optimally and efficiently. For example, if an application's boot information occupies 16-K words (or four 4-Kword parameter blocks), memory 100 will have four 4-Kword parameter blocks and seven 32-Kword main blocks remaining in parameter array plane 110-0. Then, if this particular application requires a total of twelve individual 4-Kword blocks to store parameters (that need frequent updates), the application must use up all of the remaining 11 blocks in parameter partition 110-0, and one of the eight main blocks in one of the fifteen array planes 110-1 to 110-15. The remaining seven main blocks in the array plane containing one block of parameters cannot be effectively used to store data because parallel operations cannot simultaneously access parameters and data from the same array plane. Accordingly, the memory space in the seven main blocks of the array plane containing one block of parameters becomes (effectively) unusable.

A memory with an asymmetric block architecture also requires more time to develop. In particular, an asymmetric block architecture would require additional time, manpower, and efforts to layout, simulate, and verify, and requires more effort and time to characterize and test the devices during prototyping and mass production Asymmetric array layout is also undesirable because an asymmetric layout generally uses integrated circuit area inefficiently, which results in a larger die size and greater manufacturing costs. The asymmetric layout of FIG. 1, for example, requires longer global I/O lines running vertically between the left and right portions of array plane 110-0 and requires additional column related circuitry such as sense amplifiers, column decoders, and column pass devices, row decoders, and drivers. The longer global I/O lines affect die size and performance.

Asymmetric layouts also suffer from: non-uniform power and signal bussing, which will cause memory cells to exhibit different characteristics and performance across the array, e.g., the parameter blocks on the right may be more or less subject to noise from the periphery circuits.

In addition to problems with asymmetric layout, variation in the sizes of blocks has disadvantages. In particular, differences in memory cell characteristics or performance can arise from the differences in the sizes of p-wells. Having different block sizes that use a negative gate erase process generally cause p-well sizes to vary since the p-well sizes are proportional to the block sizes. The substrate resistance can vary with the size of the p-wells and cause differences in the characteristics of memory cells in different blocks.

Redundancy implementation in an asymmetric block architecture is also more complex. In conventional Flash memory redundancy and repair schemes, a defective memory element (either a word line or a bit line) is identified during testing, disabled, and replaced by a spare memory element. As a result, whenever an incoming address matches the defective memory element's address, a redundancy circuit causes selection of the spare memory element instead of the defective memory element. Providing both word line-based and bit line-based redundancy provides the small granularity for defect replacement, but the circuit implementation can be very complex (requiring substantial complication of the decoders), requires substantial layout overhead, and adversely affects speed because of additional circuitry required in the decoders. Partition-Level redundancy represents the largest granularity, and is not practical to implement. Block-Level redundancy offers a compromise between partition-level redundancy and bit line or word line level redundancy, but block-level redundancy is not practical for a memory having asymmetric block sizes.

SUMMARY

In accordance with an aspect of the invention, a Flash memory has all blocks sized for storage of frequently changed parameters but uses the blocks for storing parameters, codes, and main data. There are no physical distinctions between main and parameter blocks. With all blocks being interchangeable and having a small size, the memory provides greater flexibility allocation of blocks for storage of data, code, or parameters.

Flash memories in accordance with the invention do not require asymmetric layouts and therefore avoid the disadvantages associated with asymmetric Flash memory layouts. In particular, array uniformity allows both right and left side arrays to have the same height (e.g., the same number of array planes per side, instead of more array planes on one side and a small array located among periphery circuits on the other side.) The layout or floor plan of the memories handles power, address, and signal buses more efficiently to reduce integrated circuit area required for these features. The layout symmetry can also provide better matching of cell performance across the memory array (e.g., better and more uniform bit line loading, noise effects, and erase characteristics for all memory cells in all array planes.)

BRIEF DESCRIPTION OF THE DRAWINGS

Use of the same reference symbols in different figures indicates similar or identical items.

DETAILED DESCRIPTION

In accordance with an aspect of the invention, a Flash memory for storing data, code, and parameters has a partition that defines array planes with blocks of uniform size. The memory supports parallel operations such as read-while-write (RWW) and read-while-erase (RWE) in any two array planes so that code or parameters required for accessing data can be read from one array plane while completing an access of other data from another array plane. The uniform block size is adapted for the information type (e.g., parameters) needing the smallest blocks, which provides maximum flexibility by allowing use of each array plane for any type of data. The uniform block size also facilitates use of an efficient block redundancy repair scheme in a Flash memory implementing parallel operations.

Figure 2:
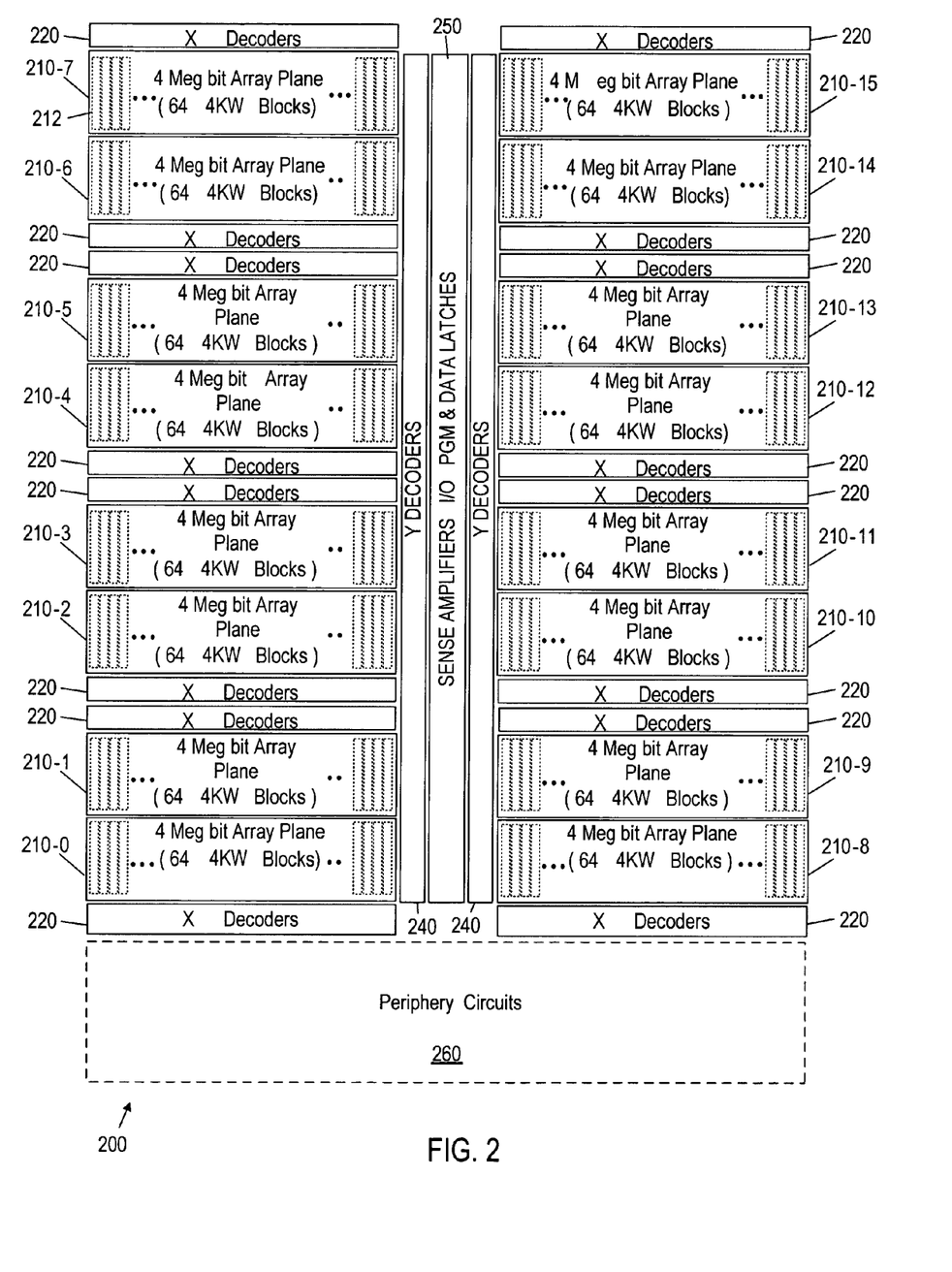
FIG. 2 shows the layout of a Flash memory having array planes with uniform block size and providing parallel operations for access of data, code, or parameters in accordance with an embodiment of the invention.

FIG. 2 illustrates a Flash memory 200 with array planes 210 that have uniform block size and implement parallel access of data, code, and/or parameters. In an exemplary embodiment, Flash memory 200 has a 64 Mbits of accessible information storage that is partitioned into sixteen 4-Mbit array planes 210-0 to 210-15, which are generically referred to herein as array planes 210. Each array plane 210 includes memory cells that are organized into blocks 212 that permit block erase operations. In accordance with an aspect of the invention, all blocks in memory 200 have the same size (e.g., the same number of memory cells), and in the exemplary embodiment of the invention, each array plane 210 includes sixty-four 4-kword blocks 212 of memory cells.

Each memory cell in Flash memory 200 can be a conventional Flash memory cell such as a stacked-gate transistor that is erased by FN tunneling, programmed by channel hot electron injection, and read by sensing bit line currents through the memory cell when the control gate (or word line) associated with the memory cell is bias at a read voltage. In another embodiment, each memory cell in Flash memory 200 can be a stacked-gate transistor that is programmed and erased by FN tunneling. In either case, each memory cell in Flash memory 200 can be a binary memory cell, a multi-bit-per-cell digital Flash memory cell, or an analog Flash memory cell.

Associated with each array plane 210 is X decode circuitry 220 that selects and biases a word line in the array plane 210 for a read or write operation. Y decode circuitry 240 selects and biases global bit lines of array planes 210. In particular, for a read/write operation, Y decode circuitry 240 connect sense amplifiers/data latches 250 to selected global bit lines. Block select circuitry (not shown) selects among blocks 212 in a selected array plane 210 and connects the global bit lines in the selected array plane to local bit lines in the selected block 212.

Figure 3:
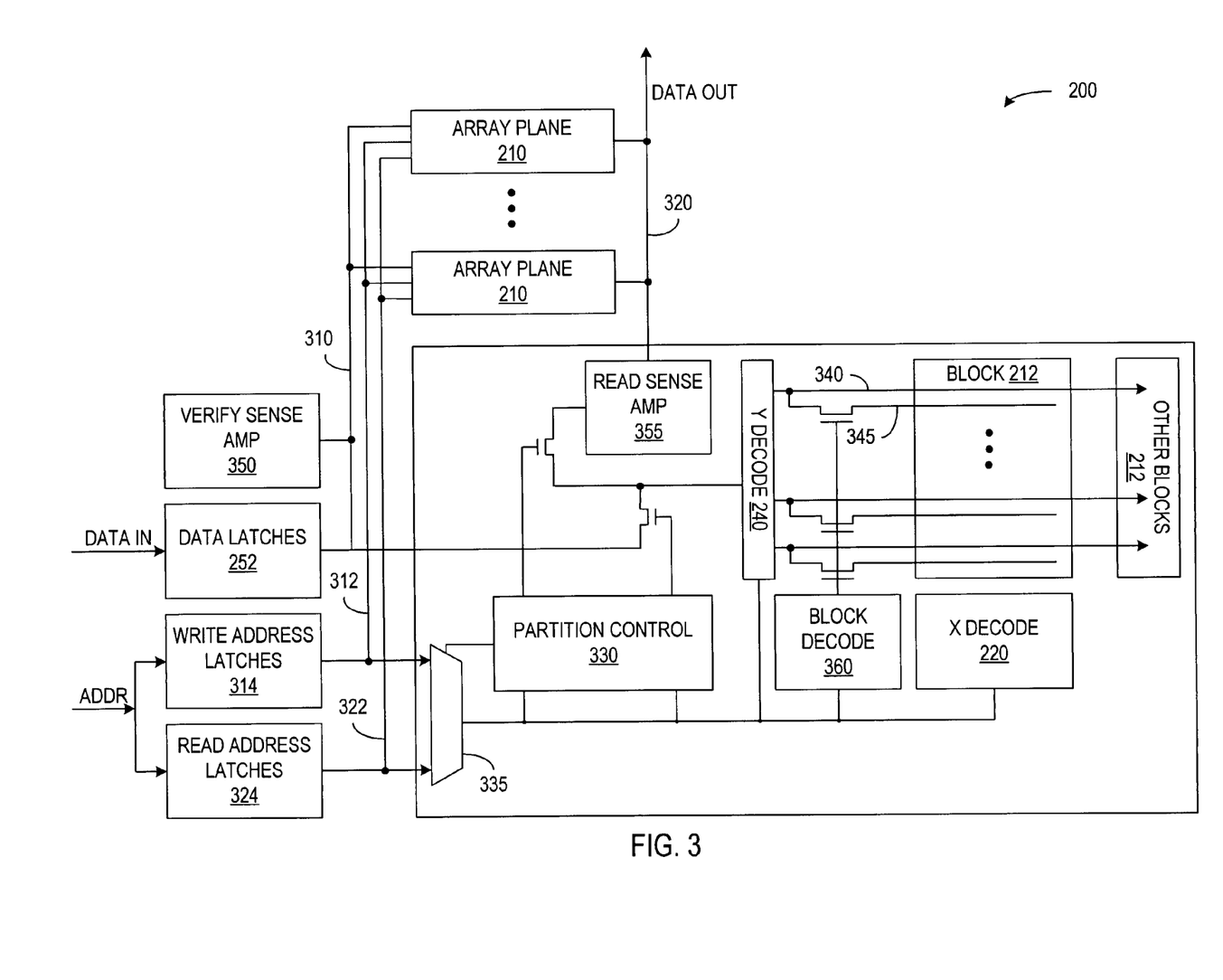
FIG. 3 shows separate read and write paths for array planes of the Flash memory of FIG. 2.

For parallel operations, memory 200 includes an internal write path and an internal read path. FIG. 3 illustrates a write data path 310 and a read data path 320 connected to array planes 210. The separate write and read data paths 310 and 320 allow any one of array planes 210 to receive data via path 310 for a write operation while another array plane 210 outputs data via path 320 for a read-while-write operation. Generally, data input and output signals on paths 210 and 220 with proper input and output buffering, share the same external data pads (not shown). I/O and control circuits (not shown) for memory 200 can control the timing of output data signals on the data pads to avoid bus contention with input data signals and can assert a busy signal to prevent an external system from driving data pads while memory 200 is outputting data.

Memory 200 also includes a write address bus 312 that connects write address latches 314 to array planes 210 and a read address bus 322 that connects read address latches 324 to array planes 210. When the external system initiates a write operation, write latches 314 latch a write address from the external system and subsequently hold the write address until memory 200 is ready to receive another write address, (e.g., until the write operation is complete). Similarly, read address latches 324 latch a read address from the external system and subsequently hold the read address until memory 200 is ready to receive another read address, (e.g., until the read operation is complete).

Each array plane 210 contains address selection circuitry including a partition control circuit 320 and multiplexer 325. Partition control circuit 320 determines whether the array plane will perform a read, a write, an erase, or no operation (e.g., idle or standby). If the array plane is selected for a read or write operation, partition control 320 causes multiplexer 325 to select either the latched read or write address, depending on whether the operation is a read or a write.

In array plane 210, decode circuitry including Y decode circuitry 240, X decode circuitry 220, and block decode circuitry 360 receive the address signal from multiplexer 335. Y decode circuitry 240 selects global bit lines 340 corresponding to a column address portion of the write signal. The number of selected global bit lines depends on number of bits simultaneously accessed in an array plane 210. FIG. 3 illustrates accessing a single bit at a time. Global bit lines 340 extend to all of the blocks 212 within the array plane 210, and block decode circuitry 360 connects global bit lines 360 to local bit lines 345 in the block 212 corresponding to the address signals. X decode circuitry 220 for the selected block 212 selects a word line 346 connected to a memory cell selected for the write or read operation.

For a write operation, data latches 252 latch input data from data pads (not shown) and provide the latched data signal via write path 310 to every array plane 210. Write address latches 314 latch the write address from address pads and provide the write address to every array plane 210 via write address bus 312. In the array plane 210 containing one or more memory cell being programmed, the partition control circuit 330 selects the write address for use in the array plane. Partition control circuit 330 also connects data latches 252 to Y decode circuitry 240 so that the selected global and local bit lines are biased to the appropriate level for the data bits being stored in selected memory cells.

For a conventional programming operation using channel hot electron injection, X decode circuitry 220 biases the selected word line of the selected memory cell to a programming voltage Vpp (typically about 8 to 12 volts). Y decode circuitry 240 biases the selected global bit lines to a programming voltage Vcp (typically about 4 to 6 volts), and the source line of the selected block is grounded. Application of the programming voltages during a series of cycles or intervals raises the threshold voltage of the memory cells selected for programming, and sense amplifiers 350 can verify whether the threshold voltages of the selected memory cell has reached a target level of a programmed memory cell. Once the target threshold voltage is reached, further programming is stopped.

For a read operation, read address latches 324 latch the read address from the address pads and provide the read address to every array plane 210 via read address bus 322. In an array plane 210 containing a selected memory cell being read, partition control circuit 330 selects the read address for use and connects a read sense amplifier 355 to Y decode circuitry 240. For a binary operation, X decode circuitry 220 biases the selected word line 346 at a voltage Vr between a high threshold voltage corresponding to a programmed memory cell and a low threshold voltage corresponding to an erased memory cell. Sense amplifiers 355 generate a data output signal according to whether sense amplifiers 355 sense currents (or measure the amount of current for multi-bit-per-cell or analog storage) through the selected memory cells.

An erase operation can generally be conducted in any of the array planes that are not performing a write operation or a read operation. In particular, an erase operation in an array plane can use read sense amplifiers 355 in the array plane for verify operations that determine whether memory cells have reach the target threshold voltage of the erase operation, and the erase operation therefore does not require use of the write or read data paths 310 or 320 (or to the write or read addresses). According to an aspect of the present invention, Flash memory 200 can perform an erase operation during a RWW operation. More specifically, while one array plane is conducting a read operation and another array plane is conducting a write operation, one or more of the other array planes can erase one or more blocks. This multi-tasking operation can be referred to as a read-while-write-while-erase (RWWWE) operation.

As noted above, Flash memory 200 implements parallel operations such as RWW, RWE, and RWWWE, which improve performance in a Flash memory that stores both data and parameters. In particular, memory 200 can read parameters for a subsequent memory access without waiting for a pending write operation to finish. Similarly, read and write operations can start without waiting for completion of an erase operation. This provides better performances than conventional Flash memories that cannot perform parallel operations. Addition of the capability to perform RWWWE operations provides further performance improvements over memory that can just perform RWW and RWE operations, particular for FN/FN-type Flash memory cells in which the write time is comparable to the erase time and sector sizes can be small, requiring frequent erase operation. The added erase capabilities of the invention simplify "look-ahead" erase techniques that while filling a first block with data, erase a second block so that the second block is ready for writing when the first block is full of data.

Memory 200 additionally has a uniform size for all blocks 212 so that any blocks 212 can be used for parameters or data. Accordingly, unlike conventional Flash memories that provide a limited number of smaller blocks for parameter storage and larger blocks for data storage, memory 200 can efficiently provide parameter storage for a system requiring more parameter storage than available in the conventional Flash memory. Additionally, the parameter storage can be located at any addresses in memory 200 instead of being limited to specific addresses such as top or bottom parameter partitions that conventional Flash memories provide.

Memory 200 additionally provides greater layout symmetry than does the conventional layout of FIG. 1. According, array planes 210 will have more uniform operating characteristics, which will permit selection of drive capacities and other circuit feature sizes to optimize performance. In contrast, layout of FIG. 1 requires global bit lines or data lines for array plane 110-0 that are longer than for the other array planes 110-1 to 110-15, making drive capacities and circuit sizes difficult to optimize for all array planes. Smaller block size for data storage results in smaller granularity. This maximizes data storage efficiency for data that comes in smaller units such as voice data. If block size is much larger than the minimum data unit, part of the data in a block may need to be retained when a unit of the block is erased. Accordingly, an erase/write operation may need to temporarily buffer part of the data from a block, erase the block, and rewrite the buffered data.

Figure 4A:
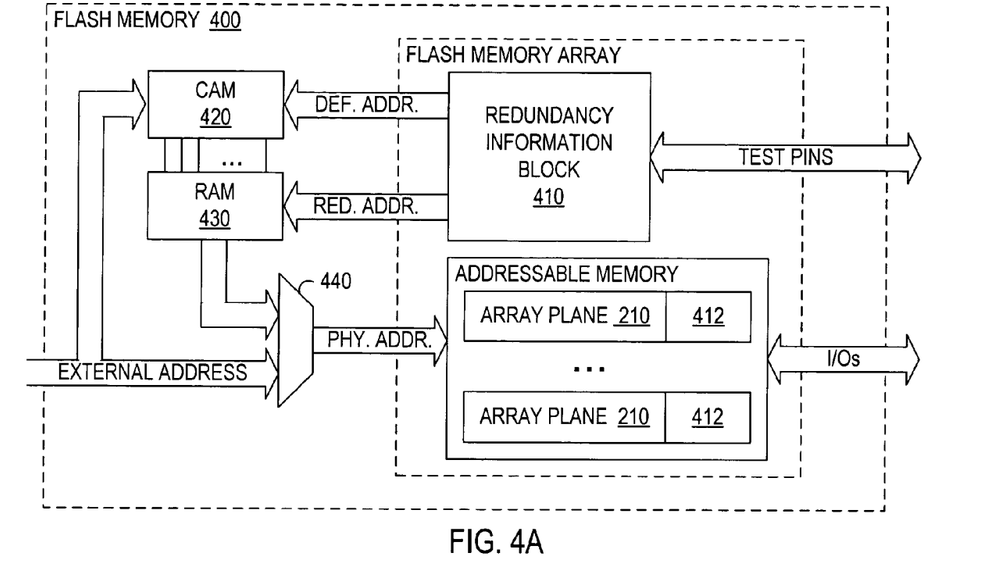
FIGS. 4A and 4B illustrate alternative implementations of redundancy systems for in Flash memories with uniform block size in accordance with an embodiment of the invention.

FIG. 4A illustrates a Flash memory 400 having a redundancy system implemented in accordance with an embodiment of the invention. Flash memory 400 includes a Flash memory array that is divided into array planes 210 as described above. Each array plane 210 contains normal blocks 212 and spare memory elements 412. The normal blocks 212 have uniform sizes and are normally used for storage when memory 400 is defect free. The spare memory elements 412 in an array plane are used to replace defective memory elements in normal blocks 212 of the array plane. Generally, spare memory elements 412 can be any set of memory cells such as a row, a column, or a block of memory cells, but in the exemplary embodiment of the invention, each spare memory element is a block of memory consisting of an array of word lines and bit lines, and each array plane includes at least one spare block of memory cells.

In addition to spare memory elements 412, the redundancy system of Flash memory 400 includes a redundancy information block 410, a content addressable memory (CAM) array 420, a random access memory (RAM) array 430, and an address multiplexer 440. Redundancy information block 410 is preferably a block or array of non-volatile Flash memory cells that is accessible via test pins. CAM array 420 is conventional content addressable memory array that activates one of its match lines when an input signal during a compare operation matches one of the values stored in CAM array 420. RAM array 430 is a conventional volatile memory array such as an SRAM or a DRAM that is connected to CAM array 420 so that RAM array outputs a stored value selected according to which of the match lines of CAM array 420 is activated. The CAM/RAM combination thus performs a "Compare-and-Substitute" function, which is described further below.

During production testing of Flash memory 400, a tester uses conventional memory test techniques to identify any defects in memory 400 and determine whether memory 400 needs repair and whether or not memory 400 can be repaired. Upon determining that Flash memory 400 contains defects but is "salvageable", the tester loads defect and redundancy information into redundancy information block 410 of memory 400. The defect and redundancy information indicates the address or addresses of defective memory element(s) and the address or addresses of spare memory elements that will replace a portion of memory containing the defective memory element(s). When each spare element 412 is a block, the redundancy information includes a block address identifying the block containing the defective memory element(s) and a block address identifying the spare memory element that replaces the defective block.

During power up, Flash memory 400 downloads the address or addresses corresponding to any defective memory element or elements from block 410 into CAM array 420 and downloads any corresponding substitute address or addresses from block 410 to RAM array 430.

For an access operation, CAM array 420 receives an address from an external system 490 and determines whether the input address matches any of the stored addresses in CAM array 420. If the input address does not correspond to any of the stored addresses in CAM array 420, a multiplexer 440 selects the input address for use as the physical address in identifying the memory cells being accessed in array planes 210. If the input address matches a stored address in CAM array 420, a match signal from CAM 420 causes SRAM 430 (or ROM 435) to output a substitute address, and multiplexer 440 selects the substitute address for use as the physical address identifying the memory cells being accessed in array planes 210.

Figure 4B:
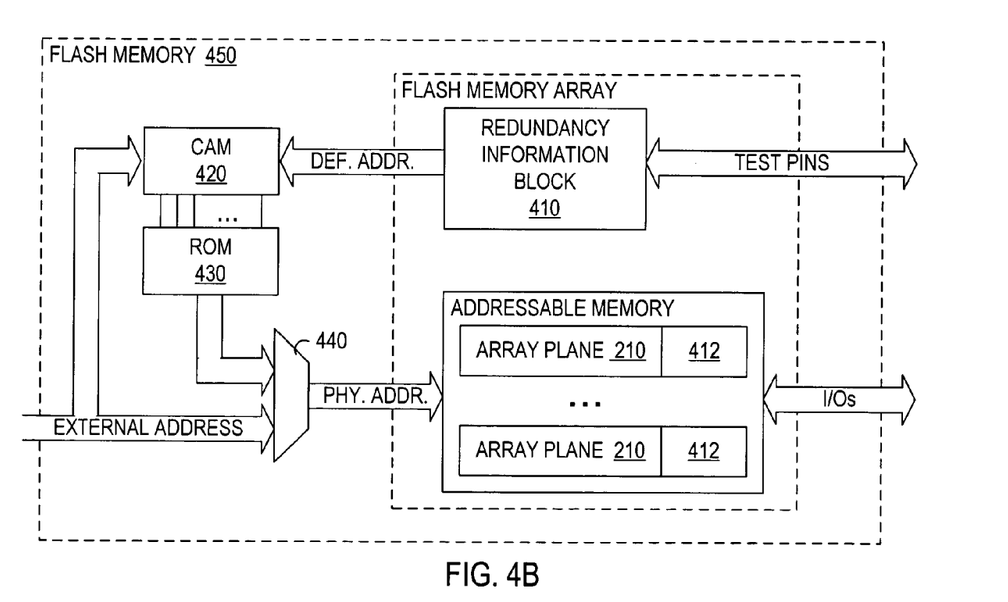

In an alternative embodiment illustrated in FIG. 4B, RAM array 430 is replaced with a read only memory (ROM) array 435 or other fixed logic that can be programmed with the substitute addresses during the repair process. Use of RAM array 430 permits changes to the redundancy information in block 410, which provides extra capabilities such as dynamic, flexible, and intelligent address-mapping capabilities and further enhances the usefulness and long-term reliability of memory 400. In particular, with RAM array 430, the defect and substitute addresses in block 410 can be updated on-the-fly during the life of memory, for example, when a memory element stops working properly or reaches a high number of erase and program cycles.

Figure 5:
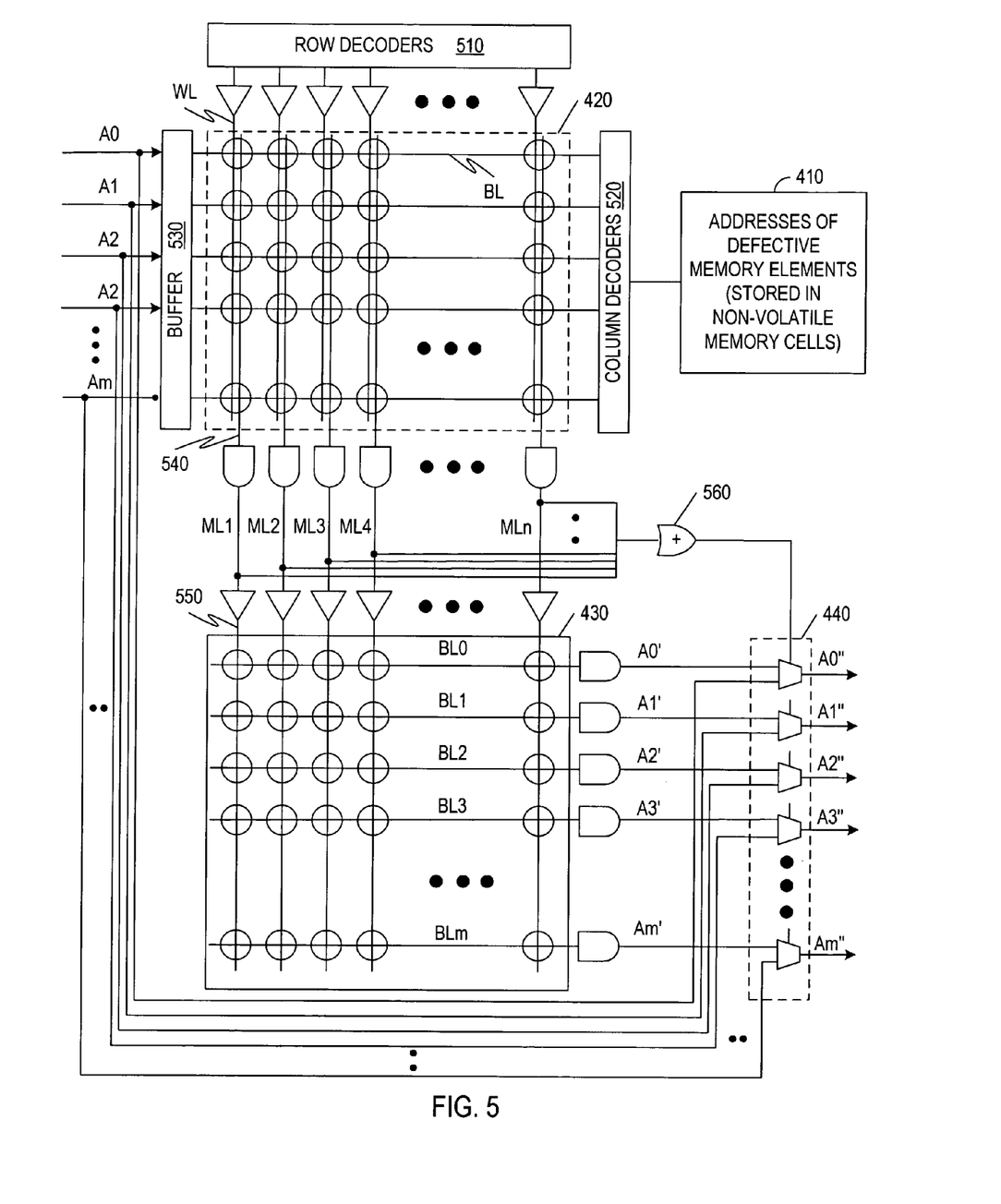
FIG. 5 shows a redundancy system using a CAM and RAM for comparison and replacement of logical addresses with physical addresses.

FIG. 5 illustrates an implementation of address mapping circuitry including CAM array 420 and RAM array 430 for the redundancy technique described above. As noted above, CAM array 420 is a volatile CAM that can be of any design capable of storing address for comparison operations. In the embodiment of FIG. 5, CAM array 420 includes a set of rows of CAM cells with the number of rows corresponding to the number of addresses that CAM array 420 can store. The number n of rows in CAM array 420 is equal to the total number of spare memory elements 412. The number m of CAM cells per row is equal to the number of address bits required for the maximum address the spare memory element or elements. Each row of CAM array has a corresponding match line 540 on which CAM array 420 activates a match signal in the event that an input value matches a value stored in the corresponding row.

Associated with CAM array 420 are row decoders 510, column decoders 520, and an input buffer 530. Row decoders 510 select a row of CAM array 520 for a write operation that stores a defective address, and column decoder 520 drives the CAM cells in the selected row as required to write the defective address. Buffer 530 provides the input address signal for comparison with the stored defective addresses.

As noted above external or logical addresses A0 to Am are input to CAM array 420 and multiplexer 440 during a memory access operation (read or write). At the same time CAM array 420 is set up for a comparison operation. Each match line 540 of CAM array 420 is connected to a corresponding word line in RAM array 430 (or ROM array 435). When a match line 540 is activated, the corresponding word line of RAM array 430 is activated, and sense amplifiers connected to bit lines of RAM array 430 generate a physical address signals A0' to Am' corresponding to a value stored in RAM array 430.

Multiplexer 440 receives external address A0 to Am and substitute address A0' to Am', and logic 560 connected to match lines 540 controls which of the two address signals multiplexer 440 selects as output signals A0" to Am". If any of the signals ML1 to MLn on match lines 540 are activated, multiplexer 440 selects substitute address A0' to Am'. The address signals A0" to Am" output from multiplexer 440 represent a physical address that identifies a normal block 212 or a spare block 412 in the Flash memory array. The physical address space, which includes addresses of spare memory elements, is thus larger than the address space for external or logical addresses, which correspond only memory cells in the normal blocks 212.

Figure 6:
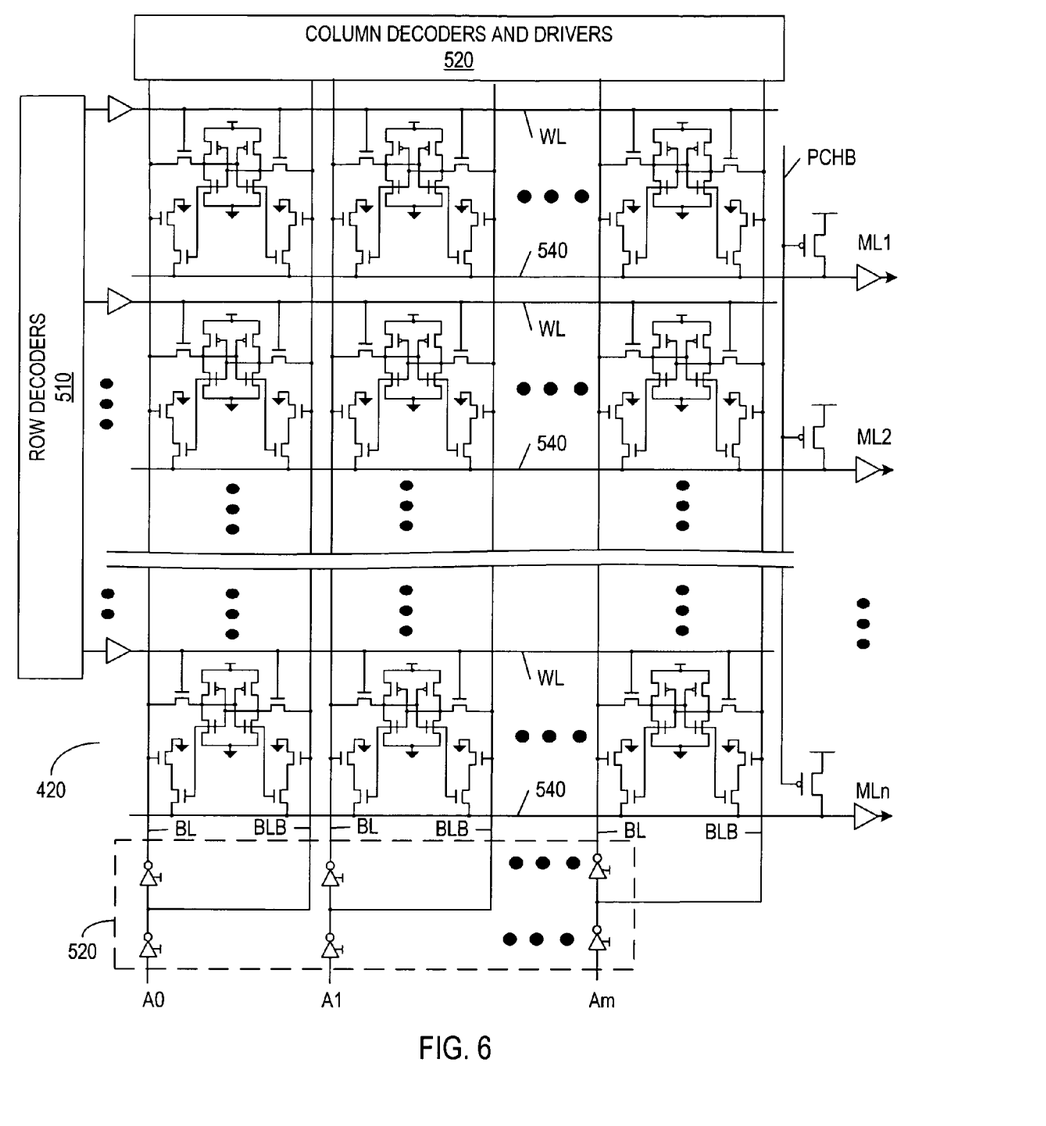
FIG. 6 shows an embodiment of a CAM for use in the redundancy system of FIG. 5.

FIG. 6 shows a CMOS transistor-level implementation of CAM array 420 in FIG. 5. In this embodiment, each CAM cell basically consists of a total of 10 transistors, a 6-T SRAM cell plus 4 match transistors. Row and Column decoders 510 and 520 are only used during the loading operation that stores defect addresses and not during the match operation. The voltage level on a match line 540 remains "high" if incoming logical address matches the defect address stored in the corresponding row of CAM array 420.

Relative to memories that lack redundancy systems and pass addresses directly from address buffers to the decoders, the use of the "CAM and RAM" redundancy approach causes a speed penalty resulting from the delays in signal propagation through CAM array 420 and RAM array 430. However, the delays through CAM and RAM arrays 420 and 430 are small because of arrays 420 and 430 are small (e.g., have very short word and bit lines), and the speed penalty for the row and column based redundancy using the "CAM and RAM" approach is expected to be more than those with the conventional redundancy system implementation.

Block-level redundancy with the "CAM and RAM" approach can virtually eliminate most of the speed penalty by directly passing the logical row and/or column address signals as the physical row and column address signals without requiring signal propagation through the CAM and RAM arrays 420 and 430. Accordingly, while the block addresses are "filtering" through the two arrays 420 and 430, the selected word lines in each of the blocks in the partition can unconditionally be selected first. Delays through the row decoders (with pre-and post-decoding), RC effects of the word lines, and the turning on of the Flash memory cell, usually take substantial time. As a result, block-level redundancy has the benefit of minimizing the speed penalty of redundancy.

Figure 7:
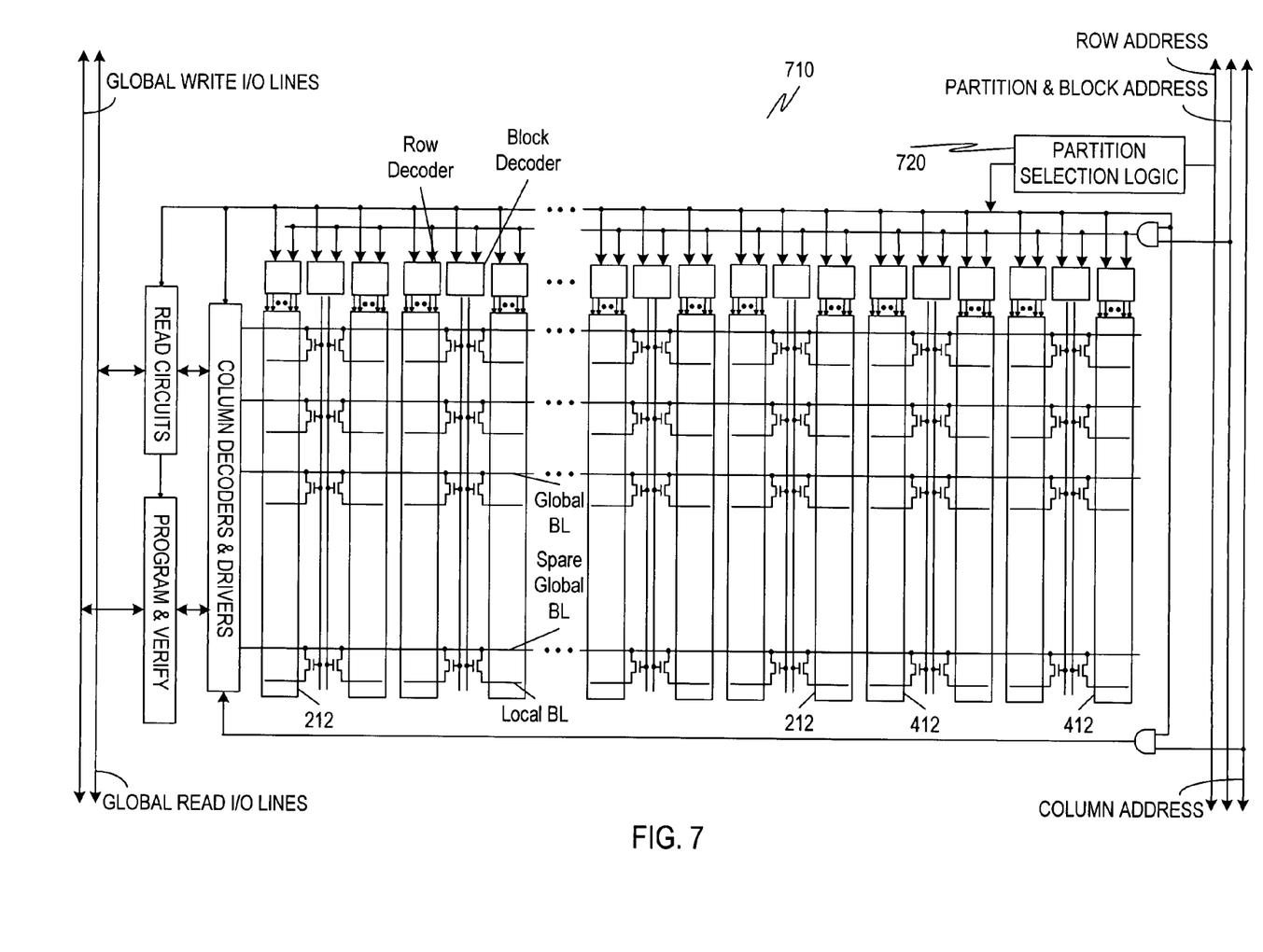
FIG. 7 shows an array plane including share block for a redundancy system in accordance with an embodiment of the invention.

FIG. 7 shows an array plane 710 using a block-level redundancy system based on the "CAM and RAM" approach. Array plane 710 is in a Flash memory providing parallel operations as described above. In the embodiment of FIG. 7, array plane 710 includes N normal blocks 212 and four spare blocks 412, but more or fewer spare blocks can be included in each array plane. Analysis of the projected failure mechanisms, expected defect density, memory density, and desired yield can determine an optimal number of spare blocks per array plane.

As disclosed above, array plane 710 does not include redundancy-supporting circuits other than the spare blocks 412. Circuitry for the row, column, and block decoders and drivers are exactly the same as would be used in an array plane without a redundancy system. This substantially simplifies the design of these circuit blocks and substantially reduces extra layout overhead due to additional circuitry in these cell pitch limited circuit blocks, compared to other conventional redundancy approaches.

Partition selection logic 720 in array plane 710 and similar partition selection logic in other array planes disable all array supporting circuits (e.g., decoders) in the unselected array planes. This saves power consumption, reduces noise, and also permits partition-level redundancy if the Flash memory includes one or more spare array planes. In particular, partition selection logic 720 uses the block address to determine whether array plane is 710 is selected. Accordingly, the redundancy system of FIG. 4A or 4B can perform the compare and replace function on a logical block address to generate a physical block address corresponding to the spare array plane.

In addition to providing spare blocks 412 in each array plane 710, each block 212 or 412 can include spare rows and/or spare columns of memory cells. In the embodiment of FIG. 7, each array plane includes a spare global bit line and associated memory cells in each block 212 or 412. Masking techniques, which are well known for CAM, can be used to mask out block and row addresses if necessary for identifying a column being replaced in a particular array plane. Accordingly, substitution of the spare global bit line for a defective global bit line in an array plane can be accomplished in a Flash memory also implementing block substitution. Providing a spare global bit line allows repair of a defective global line, which could not be repaired through substitution of spare blocks that connect to the global bit line as in FIG. 7. However, spare global bit lines may be unnecessary since defects in global bit lines are relatively uncommon in that the global lines are commonly relatively thick metal lines formed on a planarized surface with a relatively loose pitch.

In addition to use for repairing defects, the redundancy capabilities described above can extend the life of a Flash memory device. In particular, the number of program and erase cycles (P/E history) for each block can be monitored and recorded during use of the memory, and when any particular block has undergone a relatively high number of program/erase cycles that block can be replaced with another block. That block may later be reinstated for use when most other blocks in the memory reach a comparable number of cycles.

Although the invention has been described with reference to particular embodiments, the description is only an example of the invention's application and should not be taken as a limitation. For example, although the above embodiments employ specific types of memory arrays, embodiments of the invention are applicable for all types of Flash memories including but not limited to NOR (including CCNOR), AND, or NAND type, using CHE/FN or FN/FN for programming/erase, and cell architectures including stacked-gate, split-gate and/or with source-side injection, and array architectures with or without buried diffusion bit lines. Also, embodiments of the invention are applicable for multi-bit-per-cell memory, analog storage, and mixed mode data storage (i.e., analog and digital storage on the same chip). Various other adaptations and combinations of features of the embodiments disclosed are within the scope of the invention as defined by the following claims.

What is claimed is:

1. A flash memory, comprising:
 a flash memory array, including:
 (a) a plurality of array planes that constitute all storage corresponding to a logical address space of the Flash memory, each array plane further including:
 a plurality of blocks of memory cells, wherein the blocks store parameters, code, and data, and all the blocks in the array planes have a uniform size selected for parameter storage, wherein the blocks include:
 memory blocks having respective physical addresses that correspond to logical addresses of the Flash memory; and
 spare memory blocks having respective physical addresses that do not correspond to the logical addresses of the Flash memory; and
 (b) a redundancy information block of the array planes, storing therein defect addresses identifying memory blocks having defective memory elements within the array planes and substitute addresses for spare memory blocks replacing the memory blocks having the defective memory elements;
 a content addressable memory array coupled to the redundancy information block of the plurality of array planes to receive therefrom the defect addresses, and also being coupled to receive a logical signal from an external device for comparison with the defect addresses stored in the content addressable memory array;
 a memory array coupled to the redundancy information block of the plurality of array planes to receive therefrom the substitute addresses, and also having word lines coupled to respective match lines of the content addressable memory array, wherein in response to activation of one of the match lines, the memory array outputs a substitute address signal representing one of the substitute addresses stored in a row corresponding to the activated match line; and
 multiplexing circuitry connected to select between the logical address signal and the substitute address signal as a physical address signal, the multiplexing circuitry providing the physical address signal for selection of a memory cell being accessed.

2. The memory of claim 1, wherein each of the blocks comprises 4-Kword blocks of memory cells that are connected to permit simultaneous erasure of all of the memory cells in the block.

3. The memory of claim 2, further comprising:
a write data path; and
a read data path, wherein
the array planes are connected to the write data path and the read data path so as to permit any one of the array planes to conduct a read operation while any other of the array planes conducts a write operation.

4. The memory of claim 3, wherein each array plane contains erase circuitry that permits the array plane to erase a block in the array plane, while other array planes conduct read and write operations.

5. The memory of claim 3, wherein each array plane comprises at least one of the spare memory blocks.

6. The memory of claim 5, wherein each array plane comprises a spare global bit line that connects to all blocks in the array plane.

7. An operating method for a Flash memory having a plurality of array planes, the method comprising:
storing parameters, code, and data in separate blocks of memory cells, wherein each of the blocks has a uniform size selected for parameter storage;
storing defect addresses in a content addressable memory array in the Flash memory;
storing substitute addresses in a substitute address memory array in the Flash memory;
applying a first logical address from an external device to the content addressable memory array for a comparison operation;
outputting from the substitute address memory array a substitute address corresponding to a match line activated as a result of the comparison operation; and
accessing one of the blocks corresponding to the substitute address instead of another block corresponding to the first logical address.

8. The method of claim 7, further comprising applying a second logical address from the external device directly to a decoder in the Flash memory while applying the first logical address to the content addressable memory, wherein a combination of the first and second logical addresses identifies a memory cell.

9. The method of claim 7, wherein accessing one of the blocks comprises accessing a first array plane in the Flash memory while a second array plane in the Flash memory conducts a second operation.

10. The method of claim 9, wherein accessing the first array plane comprises reading a memory cell in the first array plane, and the second operation comprises writing to a memory cell in the second array plane.

11. The method of claim 9, wherein accessing the first array plane comprises reading a memory cell in the first array plane, and the second operation comprises erasing a block in the second array plane.

12. The method of claim 7, wherein storing defect addresses in a content addressable memory array in the Flash memory and storing substitute addresses in a substitute address memory array in the Flash memory, comprises:
storing the defect addresses and substitute addresses for each array plane in a redundancy information block;
transferring the defect addresses from the redundancy information block to the content addressable memory array; and
transferring the substitute addresses from the redundancy information block to the substitute address memory array.

13. The method of claim 12, wherein transferring the defect addresses from the redundancy information block to the content addressable memory array and transferring the substitute addresses from the redundancy information block to the substitute address memory array occurs during a power up operation of the Flash memory.

14. An operating method for a Flash memory, comprising:
storing parameters, code, and data in separate blocks of memory cells, wherein each of the blocks has a uniform size selected for parameter storage;
storing defect addresses in a content addressable memory array in the Flash memory;
storing substitute addresses in a substitute address memory array in the Flash memory;
applying a first logical address from an external device to the content addressable memory array for a comparison operation;
applying a second logical address from the external device directly to a decoder in the Flash memory while applying the first logical address to the content addressable memory, wherein a combination of the first and second logical addresses identifies a memory cell;
outputting from the substitute address memory array a substitute address corresponding to a match line activated as a result of the comparison operation; and
accessing one of the blocks corresponding to the substitute address instead of another block corresponding to the first logical address,
wherein the first logical address is a block address and the second logical address identifies a memory cell within a block.

15. The method of claim 14, wherein the second logical address is a row address.

* * * * *